United States Patent
Lu et al.

(10) Patent No.: US 6,949,979 B2
(45) Date of Patent: Sep. 27, 2005

(54) DESIGNING METHODS AND CIRCUITS FOR MULTI-BAND ELECTRONIC CIRCUITS

(75) Inventors: Shey-shi Lu, Taipei (TW); Hung-Wei Chiu, Taipei (TW); Po-Wei Lee, Taipei (TW); Yu-Che Yang, Sansing Shang (TW)

(73) Assignees: Memetics Technology Co. LTD, Taipei (TW); National Taiwan University, Taipei (TW)

( * ) Notice: Subject to any disclaimer, the term of this patent is extended or adjusted under 35 U.S.C. 154(b) by 92 days.

(21) Appl. No.: 10/723,130

(22) Filed: Nov. 26, 2003

(65) Prior Publication Data

US 2004/0111681 A1 Jun. 10, 2004

(30) Foreign Application Priority Data

Dec. 5, 2002 (TW) ........................ 91135334 A
Dec. 19, 2002 (TW) ........................ 91136641 A

(51) Int. Cl.$^7$ ............................................... H03F 3/04
(52) U.S. Cl. ..................................... 330/305; 330/310
(58) Field of Search ........................ 330/51, 310, 311, 330/305, 296, 285

(56) References Cited

U.S. PATENT DOCUMENTS

| | | | |
|---|---|---|---|
| 3,486,126 A | * 12/1969 | Cadigan et al. | 330/305 |
| 3,717,820 A | * 2/1973 | Garcia et al. | 330/305 |
| 4,409,557 A | * 10/1983 | Sechi | 330/277 |

OTHER PUBLICATIONS

S. Wu and B. Razavi, "A 900–MHZ/1.8–Ghz CMOS Receiver For Dual–Band Application," IEEE JSSC, pp. 2178–2185, Dec. 1998.
R. Magoo et al., "A Triple–Band 900/1800/1900 MHz Low–Power Image–Reject Front–End For GSM," ISSCC Digest of Technical papers, pp. 408–409, Feb. 2001.
K.L. Fong "Dual–Band High–Linearity Variable–Gain Low–Noise Amplifiers For Wireless Applications," ISSCC Digest of Technical papers, pp. (11 total) Feb. 1999.
H. Hashemi and A. Hajimiri, "Concurrent Multiband Low–Noise Amplifiers–Theory, Design, And Applications", IEEE Transactions on Microwave Theory and Techniques, pp. 288–310, 2002.

* cited by examiner

*Primary Examiner*—Henry Choe
(74) *Attorney, Agent, or Firm*—Silicon Valley Patent Group LLP

(57) ABSTRACT

The designing method and circuits for a multi-band electronic circuit having at least one transistor have been proposed. The proposed method includes steps of: (a) changing the capacitance between the input terminal and the output terminal of the transistor of the circuit, and (b) obtaining the resonant frequency of the circuit in response to the changed capacitance for switching among multiple bands. The designing method and circuits for a multi-band amplifier, which includes at least one transistor having an input terminal and an inductor electrically connected to the input terminal of the transistor, have been proposed too. The designing method for a multi-band amplifier includes steps of: changing the bias of the transistor, and switching the resonant frequency of the input impedance of the transistor and the inductor in response to the changed bias for switching among multiple bands.

12 Claims, 15 Drawing Sheets

DESIGNING METHODS AND CIRCUITS FOR MULTI-BAND ELECTRONIC CIRCUITS

CROSS REFERENCE TO PRIOR APPLICATION

This application claims priority to each of two Patent Applications filed in Taiwan, R.O.C., namely: (1) Taiwanese application number 091135334, filed Dec. 5, 2002, entitled "A Multi-Band Electronic Circuit", and (2) Taiwanese application number 091136641, filed Dec. 19, 2002, entitled "A Multi-Band Electronic Circuit". These priority claims are made under 35 U.S.C. 119, as per an agreement signed between the United States and Taiwan on Apr. 10, 1996.

FIELD OF THE INVENTION

The present invention relates to the multi-band electronic circuits, and more particularly to the designing methods and circuits for multi-band electronic circuits.

BACKGROUND OF THE INVENTION

Wireless communication has evolved into a world of multi-standards/multi-services with operating frequencies of 900 MHz/1.8 GHz/1.9 GHz bands for GSM, 1.5 GHz band for GPS and 2.4 GHz/5.2 GHz/5.7 GHz bands for WLAN. Therefore, it is desirable to combine two or more standards in one mobile unit. The primary challenge in designing multi-band transceivers is increasing the functionality of such communication systems while minimizing the number of additional hardware such as low noise amplifiers (LNAs). Typical design strategies have used different LNAs for different frequency bands. However, this inevitably increases cost, power consumptions and form-factor. In other words, to design a three-band transceiver using the frequency bands of 0.9 GHz, 1.8 GHz, and 1.9 GHz, three different low-noise amplifiers must be designed to cope with the three different frequency bands. Therefore, the relevant gains, noise figures, input impedances, and output impedances are all designed for the specific frequency band when a low-noise amplifier is designed. Therefore, the form factor and power consumption of the multi-band transceiver are much greater than the single-band transceiver. As an example, please refer to the integrated multi-band super-heterodyne receiver of the prior art as shown in FIG. 1. From the antenna 100, through the frequency band selection filter 101 (102 is a bandpass filter), the low-noise amplifier 103, the images rejection filter 104 (105 is a bandpass filter), the mixer having an input of the local oscillator signal 106, and the channel selection filter 107 (108 is a bandpass filter), all of which form the independent receiving route of the first application frequency band. From the antenna 109, through the frequency band selection filter 110 (111 is a bandpass filter), the low-noise amplifier 112, the images rejection filter 113 (114 is a bandpass filter), the mixer having an input of the local oscillator signal 115, and the channel selection filter 116 (117 is a bandpass filter), all of which form the independent receiving route of the second application frequency band. From the antenna 118, through the frequency band selection filter 119 (120 is a bandpass filter), the low-noise amplifier 121, the images rejection filter 122 (123 is a bandpass filter), the mixer having an input of the local oscillator signal 124, and the channel selection filter 125 (126 is a bandpass filter), all of which form the independent receiving route of the third application frequency band.

Using the independent receiving route of the first application frequency band as an example, signals will be received by the antenna 100 firstly. These received signals will go through a frequency band selection filter 101 so as to filter out the signals outside the desired frequency band secondly. Signals fall within the desired band will go into the low-noise amplifier 103 to be amplified and to avoid the increasing of noises thirdly. The amplified signals will go through an image rejection filter 104 to delete the noises generated by the image frequencies. After finishing the down-conversion, a channel of the first application frequency band is selected by the channel selection filter 107. A common portion of the above-mentioned circuit shared by the first independent route, the second independent route, and the third independent route, which includes the mixer 127, the analog-digital converter 128, and the digital signal processor 129, is connected to the channel selection filter 107. If a signal is confirmed belonging to an application band, it is down-converted and is digitized by the analog-digital converter 128. Finally, the digitized signals are processed in the digital signal processor 129.

From the above description, the traditional way of integrating a multi-band receiver is to design the circuit applicable to each frequency band separately and to combine all these circuits together. The critical circuits in the receiver, the low-noise amplifiers, have to be designed one for each different frequency band too. Thus the form factor and the power consumption of the whole circuit are increased dramatically. In the prior art, this is the method employed to integrate a circuit applicable to the multi frequency band (that is, to employ a different amplifier to handle each of the different frequency band).

Please refer to the following references:
a. S. Wu and B. Razavi, "A 900-MHZ/1.8-GHz CMOS receiver for dual-band applications," IEEE JSSC, pp. 2178–2185, December 1998;
b. R. Magoon, et. al, "A triple-band 900/1800/1900 MHz low-power image-reject front-end for GSM," ISSCC Digest of Technical papers, pp. 408–409, February 2001;
c. K, L, Fong "Dual-band high-linearity variable-gain low-noise amplifiers for wireless applications," ISSCC Digest of Technical papers, February 1999.

Recently, a designing method regarding using the same low-noise amplifier to process all of the multi-band signals has been proposed by H. Hashemi and A. Hajimiri as described in the paper "Concurrent multiband low-noise amplifiers-theory, design, and applications," IEEE Transactions on Microwave Theory and Techniques, pp. 288–301, 2002. Since the same low-noise amplifier can be employed to fulfill the requirements of all the different frequency bands, the design of the transceiver for the integration of multi-band applications can be simplified (no need to design multiple low-noise amplifiers). Both the form factor and the power consumption of the whole circuit can be decreased which is quite advantageous to the merchandizing of the circuit.

The above-mentioned designing method proposed by H. Hashemi and A. Hajimiri is different from the traditional designing method for the low-noise amplifiers. As for the traditional designing method for the low-noise amplifiers in the prior art, please refer to FIG. 2. The source inductor 207 is employed to generate the resistance desired for the input impedance matching (usually 50 ohm). The inductor 201 is also employed to achieve a resonance at the desired frequency band with the total input capacitance looking into the gate. At the output terminal, resonant LC tank formed by the inductor 204 and the capacitor 208 is employed to choose the desired frequency band.

As for the designing method for the multi-band low-noise amplifiers proposed by H. Hashemi and A. Hajimiri, please refer to FIG. 3. In addition to the inductor 310 for generating the resistance needed by the input impedance matching at the input terminal (usually 50 ohm) and the inductor 304 for achieving the resonance at the desired frequency band are employed as in the prior art, the capacitor 302 and the inductor 301 electrically connected in parallel are also employed. The purpose of doing this is to add another resonant frequency to acquire the function of multi-band input impedance matching. In addition to the resonant LC tank including the inductor 312 and the capacitor 313 connected in parallel at the output terminal is employed as in the prior art, inductor 307 and capacitor 306 connected in parallel are also employed. The purpose of doing this is also to add another resonant frequency to acquire the function of selecting the desired frequency band among the given multi-bands. In other words, through increasing the number of inductors and capacitors to acquire the functions regarding the multi-band applications is employed by H. Hashemi and A. Hajimiri. A designing method like this has many disadvantages, which are described as follows.

Firstly, five inductors (that is inductors 301, 304, 307, 310, and 312, wherein inductors 301 and 304 are not on the chip) and three capacitors (the capacitors 302, 306, and 313 are included, in which the capacitor 302 is not on the chip) are employed in this design with two extra inductors and two extra capacitors compared to the traditional design of the low-noise amplifier (please refer to FIG. 2, in which there are three inductors: 201, 204, and 207 and one capacitor 208). Because the number of the inductors and the capacitors are increased and off-chip inductors and capacitor are employed (square measures of which are much greater than those on the chip), the form factor of the whole circuit is increased dramatically, and such a design cannot be fabricated on a single chip. Besides, the off-chip inductors and capacitor would need extra jobs of wire-bonding and wiring, which will increase the cost and decrease the reliability, and hence are not facilitate to the mass-producing and merchandizing of the ICs. Usually, when a low-noise amplifier is designed, the circuit designers try to use as few inductors as possible for the reasons given below. Firstly, the inductors will occupy a lot of precious chip area. Secondly, the quality factors of the inductors on the chips are not high, which will degrade the noise figures. That is why the utilization of the inductors is avoided as much as possible when a low-noise amplifier is designed. However, the method proposed by H. Hashemi and A. Hajimiri increases the utilization of the inductors instead.

That is why a new kind of multi-band amplifiers, which will not increase the form factor and the number of elements of the whole circuit, and will not require extra jobs of wire-bonding and wiring, are really in need.

Keeping the drawbacks of the prior arts in mind, and employing experiments and research full-heartily and persistently, the designing methods and circuits for multi-band electronic circuits are finally conceived by the applicants.

SUMMARY OF THE INVENTION

It is therefore an object of the present invention to provide the designing method and circuits for the multi-band electronic circuits.

It is therefore another object of the present invention to provide the designing method and circuits for the multi-band amplifiers.

According to the aspect of the present invention, the designing method for a multi-band electronic circuit having at least one transistor includes steps of: (a) changing a capacitance between an input terminal and an output terminal of the at least one transistor of the electronic circuit, and (b) obtaining a resonant frequency of the electronic circuit which is switched from a first band to a second band in response to the changed capacitance for switching among multiple bands, in which each of the first band and the second band is one of a plurality of bands of the resonant frequency.

Preferably, the transistor is one of the bipolar transistors or the field effect transistors.

Preferably, the input terminal and the output terminal of the bipolar transistor are the base and the collector of the bipolar transistor respectively.

Preferably, the input terminal and the output terminal of the field effect transistor are the gate and the drain of the field effect transistor respectively.

Preferably, the step (a) is achieved by a combination of a switch and a capacitor electrically connected in series, which combination is electrically connected between the input terminal and the output terminal in parallel.

Preferably, the step (a) is achieved by a variable capacitor electrically connected between the input terminal and the output terminal in parallel.

According to another aspect of the present invention, the multi-band electronic circuit includes: a transistor, a first inductor electrically connected to an input terminal of the transistor, and a variable capacitor component electrically connected between the input terminal and the output terminal of the transistor, in which, through changing a capacitance of the variable capacitor component, a resonant frequency of the electronic circuit is switched from a first band to a second band in response to the changed capacitance for switching among multiple bands, in which each of the first band and the second band is one of a plurality of bands of the resonant frequency.

Preferably, the variable capacitor component is the combination of a switch and a capacitor electrically connected in series, or a varactor.

Preferably, the transistor is the bipolar transistor or the field effect transistor.

Preferably, the input terminal and the output terminal of the bipolar transistor are the base and the collector of the bipolar transistor respectively, and the emitter of the bipolar transistor is electrically connected to the ground.

Preferably, the electronic circuit further includes a second inductor having one end electrically connected to the emitter of the bipolar transistor and the other end electrically connected to the ground.

Preferably, the input terminal and the output terminal of the field effect transistor are the gate and the drain of the field effect transistor respectively, and the source of the field effect transistor is electrically connected to the ground.

Preferably, the electronic circuit further includes a second inductor having one end electrically connected to the drain of the field effect transistor and the other end electrically connected to the ground.

According to another aspect of the present invention, an multi-band electronic circuit includes: a first transistor having an input electrode, a first electrode electrically connected to the ground, and a second electrode, a first inductor electrically connected to the input electrode of the first transistor, a first resistor having one end electrically connected to the second electrode of the first transistor, a first power supply electrically connected to the other end of the first resistor, a capacitor having one end electrically connected to the second electrode of the first transistor, a second transistor having an input electrode electrically connected to the other end of the capacitor, a first electrode electrically connected to the ground and a second electrode, a second resistor having one end electrically connected to the second electrode of the second transistor, a second power supply electrically connected to the other end of the second resistor, a third resistor electrically connected between the input electrode and the second electrode of the second transistor, and a variable capacitor component electrically connected between the input electrode and the second electrode of the first transistor, in which, through changing the capacitance of the variable capacitor component, the resonant frequency of the input impedance looking into the input electrode of the first transistor and the first inductor of the electronic circuit is switched from a first band to a second band in response to the changed capacitance for switching among multiple bands, in which either the first band or the second band is one of a plurality of bands of the resonant frequency.

Preferably, the variable capacitor component is the combination of a switch and a capacitor electrically connected in series, or a varactor.

Preferably, the electronic circuit further includes a second inductor having one end electrically connected to the first electrode of the first transistor and the other end electrically connected to the ground.

Preferably, the first and second transistors are two bipolar transistors or two field effect transistors.

Preferably, the input, first and second electrodes of each of the two bipolar transistors are the base, the emitter and the collector of the bipolar transistors respectively.

Preferably, the input, first and second electrodes of each of the two field effect transistors are the gate, the source and the drain of the field effect transistors respectively.

According to another aspect of the present invention, the designing method for an electronic circuit of a multi-band amplifier, in which the electronic circuit includes at least one transistor having an input terminal and an inductor electrically connected to the input terminal of the at least one transistor, includes steps of: changing the bias of the at least one transistor of the electronic circuit, and switching the resonant frequency of the input impedance of the at least one transistor and the inductor from a first band to a second band in response to the changed bias for switching among multiple bands, in which each of the first band and the second band is one of a plurality of bands of the resonant frequency.

Preferably, the transistor is a bipolar transistor or a field effect transistor.

Preferably, the input terminal of the bipolar transistor is the base of the bipolar transistor.

Preferably, the bias of the bipolar transistor is one selected from a group consisting of a bias current at the base, a bias current at a collector of the bipolar transistor, a bias current at an emitter of the bipolar transistor, and a bias voltage at the base.

Preferably, the input terminal of the field effect transistor is the gate of the field effect transistor.

Preferably, the bias of the field effect transistor is the bias current from the drain to the source of the field effect transistor or the bias voltage at the gate.

According to another aspect of the present invention, the electronic circuit for a multi-band amplifier includes: a first transistor having an input electrode, a first electrode electrically connected to the ground, and a second electrode, an inductor electrically connected to the input electrode of the first transistor, a first resistor having one end electrically connected to the second electrode of the first transistor, a first power supply electrically connected to the other end of the first resistor, a capacitor having one end electrically connected to the second electrode of the first transistor, a second transistor having an input electrode electrically connected to the other end of the capacitor, a first electrode electrically connected to the ground, and a second electrode, a second resistor having one end electrically connected to the second electrode of the second transistor, a second power supply electrically connected to the other end of the second resistor, and a third resistor electrically connected between the input electrode and the second electrode of the second transistor, wherein, through changing the bias of the first transistor of the electronic circuit, the resonant frequency of the input impedance of the first transistor and the inductor of the electronic circuit is switched from a first band to a second band in response to the changed bias for switching among multiple bands, in which each of the first band and the second band is one of a plurality of bands of the resonant frequency.

Preferably, the first and second transistors are two bipolar transistors or two field effect transistors.

Preferably, the input, first and second electrodes of each of the two bipolar transistors are the base, the emitter and the collector of the bipolar transistor respectively.

Preferably, the bias of the first bipolar transistor can be the bias current at the base, the bias current at the emitter, the bias current at the collector, or the bias voltage at the base.

Preferably, the input, first and second electrodes of each of the two field effect transistors are the gate, the source and the drain of the field effect transistor respectively.

Preferably, the bias of the first field effect transistor can be the bias current from drain to the source or the bias voltage at the gate.

The present invention may be best understood through the following descriptions with reference to the accompanying drawings, in which:

DETAILED DESCRIPTION OF THE PREFERRED EMBODIMENT

Figure 1:
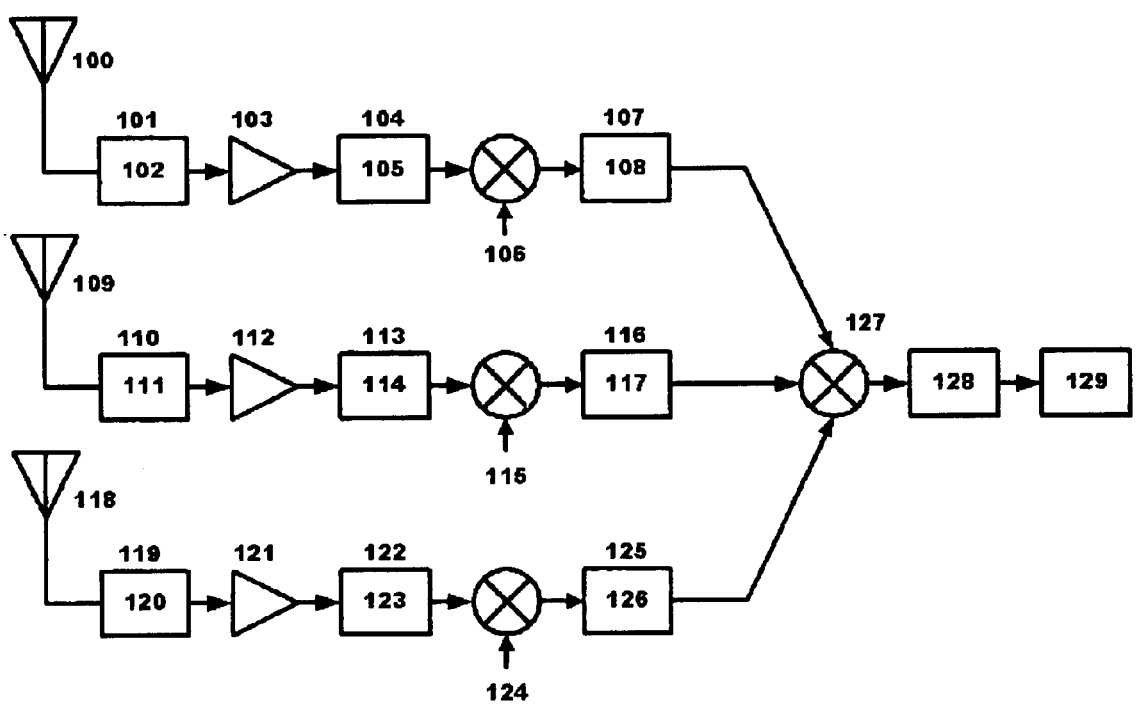
FIG. 1 is the block diagram of the multi-band superheterodyne receiver of the prior art.
Figure 2:
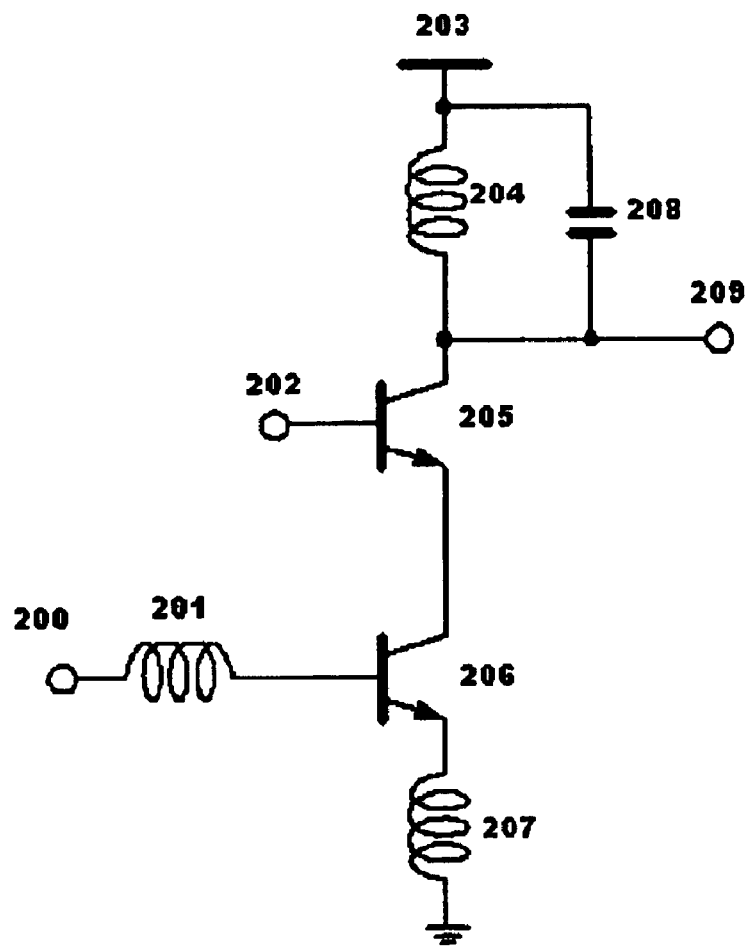
FIG. 2 is the circuit diagram of the low-noise amplifier of the prior art.
Figure 3:
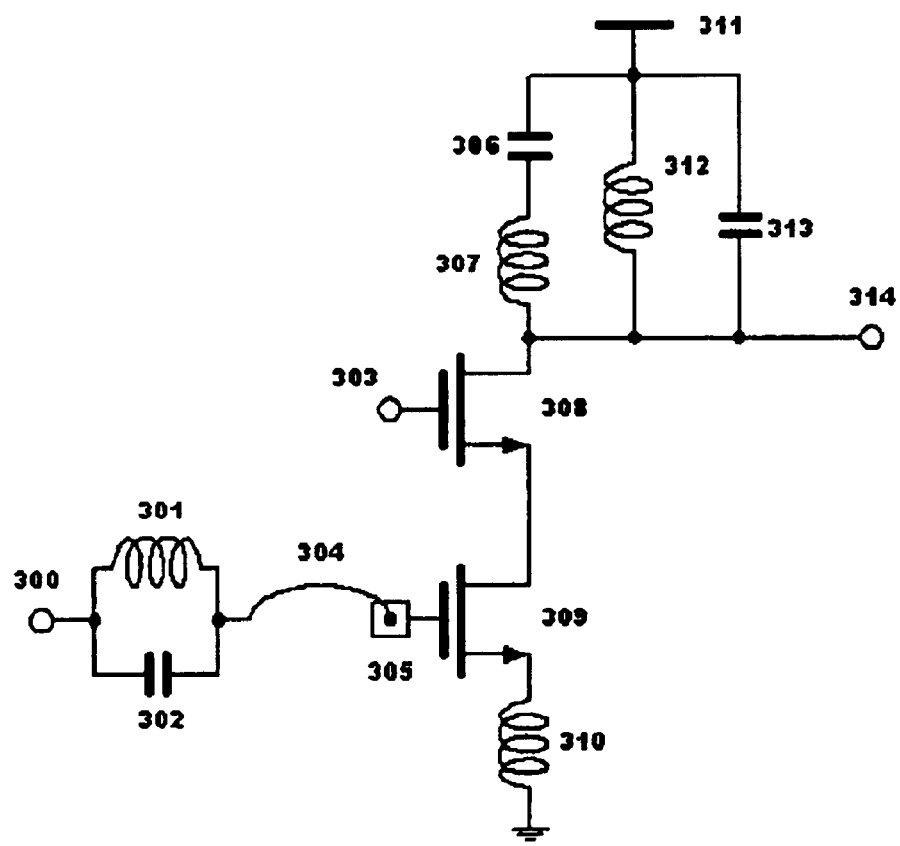
FIG. 3 is the circuit diagram of the multi-band low-noise amplifier proposed by H. Hashemi and A. Hajimiri.
Figure 4:
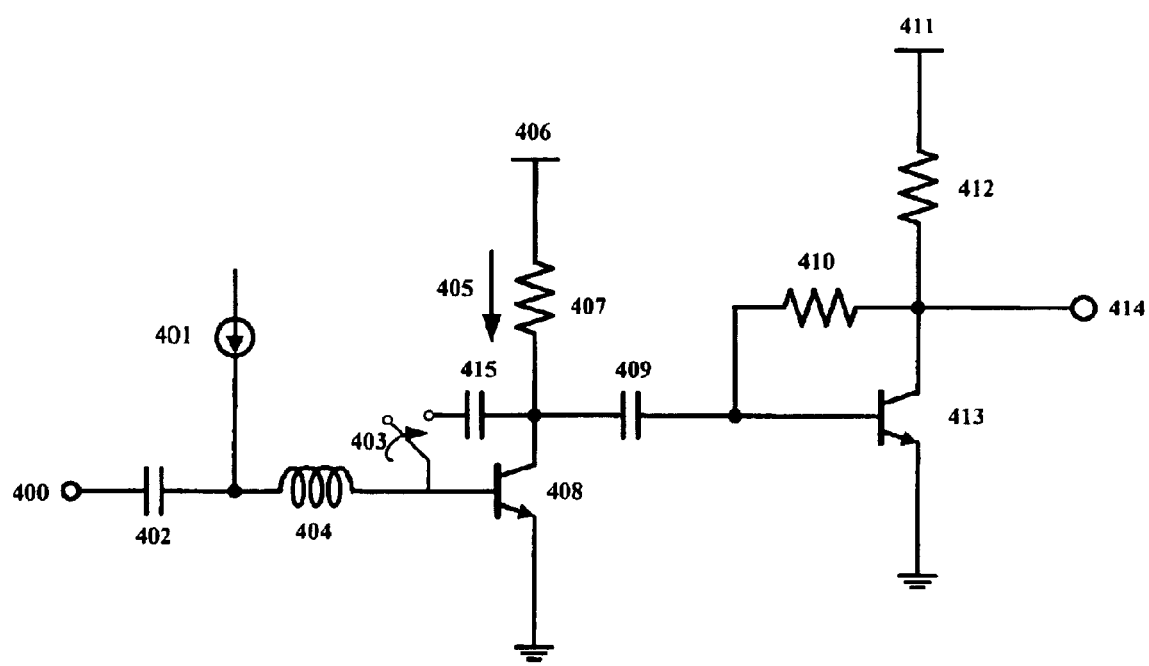
FIG. 4 is the circuit diagram of a 2.4/5.2/5.7 GHz multi-band low-noise amplifier according to the first preferred embodiment of the present invention.

Please refer to FIG. 4, which shows the circuit diagram of a 2.4/5.2/5.7 GHz multi-band electronic circuit according to the first preferred embodiment of the present invention. The circuit includes an input terminal 400, a bias current source 401, a first (DC block) capacitor 402, an electronic switch 403, a first inductor 404, a first power supply 406, a first resistor 407 (with a collector current 405), a second capacitor 415, a first transistor 408, a third (DC isolation/AC coupling) capacitor 409, a second power supply 411, a second resistor 412, a third resistor 410, a second transistor 413, and an output terminal 414. In FIG. 4, the first bipolar transistor 408 has an emitter electrically connected to the ground, the first inductor 404 is electrically connected to the base of the first bipolar transistor 408, the first resistor 407 has one end electrically connected to the collector of the first bipolar transistor 408, the first power supply 406 is electrically connected to the other end of the first resistor 407, the third capacitor 409 has one end electrically connected to the collector of the first bipolar transistor 408, the second bipolar transistor 413 has the emitter electrically connected to the ground and the base electrically connected to the other end of the third capacitor 409, the second resistor 412 has one end electrically connected to the collector of the second bipolar transistor 413 and the other end electrically connected to the second power supply 411, the third resistor 410 is electrically connected between the base and the collector of the second bipolar transistor 413, and a variable capacitance component (including the electronic switch 403 and the second capacitor 415 electrically connected in series) electrically connected between the input electrode and the second electrode of the first bipolar transistor 408. Through changing the capacitance of the variable capacitance component, the resonant frequency of the input impedance looking into the base of the first bipolar transistor 408 and the first inductor 404 of the electronic circuit is switched from a first band to a second band in response to the changed capacitance for switching among multiple bands. In which, each of the first band and the second band is one of a plurality of bands of the resonant frequency. Though the bipolar-junction transistors/heterojunction-bipolar transistors are employed in this circuit for switching among multiple bands, field effect transistors can be employed too. In the first preferred embodiment of the present invention as shown in FIG. 4, both the first resistor 407 and the second resistor 412 have a resistance of 300 ohms, the third resistor 410 has a resistance of 600 ohms, the third (DC isolation/AC coupling) capacitor 409 has a capacitance of 3 pF, and the areas of emitter of the first transistor 408 and the second transistor 413 are both 12.18 $\mu m^2$. The TSMC 0.35 $\mu m$ SiGe BiCMOS process is employed. The voltages of power supplies 406 and 411 are both 2 volts. Referring to FIG. 4, a series combination of the electronic switch 403 and the second capacitor 415 is electrically connected between the input electrode and the second electrode of the first bipolar transistor 408. Through switching between the open status and closed status of the electronic switch 403, the total input capacitance $C_{IN}$ looking into the base of the first bipolar transistor 408 will be changed. The $C_{IN}$ and the first inductor 404 electrically connected to the base of the first bipolar transistor 408 constitute the resonant circuit for achieving the input impedance matching. When the electronic switch 403 is not conducted, which means the electronic switch 403 is open, the resonant circuit formed by the $C_{IN}$ and the first inductor 404 electrically connected to the base of the first bipolar transistor 408 will achieve the input impedance matching at 5.2/5.7 GHz (for WLAN IEEE 802.11a standard). Now consider the situation when the electronic switch 403 is closed, i.e. the electronic switch 403 is a short circuit. Since the second capacitor 415 is electrically connected between the input electrode and the second electrode of the first bipolar transistor 408, the total input capacitance $C_{IN}$ looking into the base of the first bipolar transistor 408 will be increased. Thus the resonant circuit formed by the $C_{IN}$ and the first inductor 404 electrically connected to the base of the first bipolar transistor 408 will achieve the input impedance matching at 2.4 GHz (for WLAN IEEE 802.11b standard). As for the output impedance matching at the output terminal 414, the feedback resistor 410 is employed for this purpose. When the output impedance matching is not needed (e.g., in cases of zero-IF and low-IF receivers), the feedback resistor 410 may not be necessary for the output impedance matching. The first resistor 407 and the second resistor 412 are the loads of the first transistor 408 and the second transistor 413 respectively. Though the resistors are employed as the loads in this first preferred embodiment, the inductors and capacitors can be employed as the loads too. The main issue here is that a multi-band impedance matching at the input terminal of the provided circuit must be achieved. Since only one inductor 404 is employed, and the first inductor 404 is manufactured on-chip, thus not only the whole proposed circuit can be manufactured on a single chip but also the area of the proposed circuit is relatively small (only 355 $\mu m \times 155$ $\mu m$). These are the advantages to facilitate the merchandizing of the proposed circuits.

Figure 5:
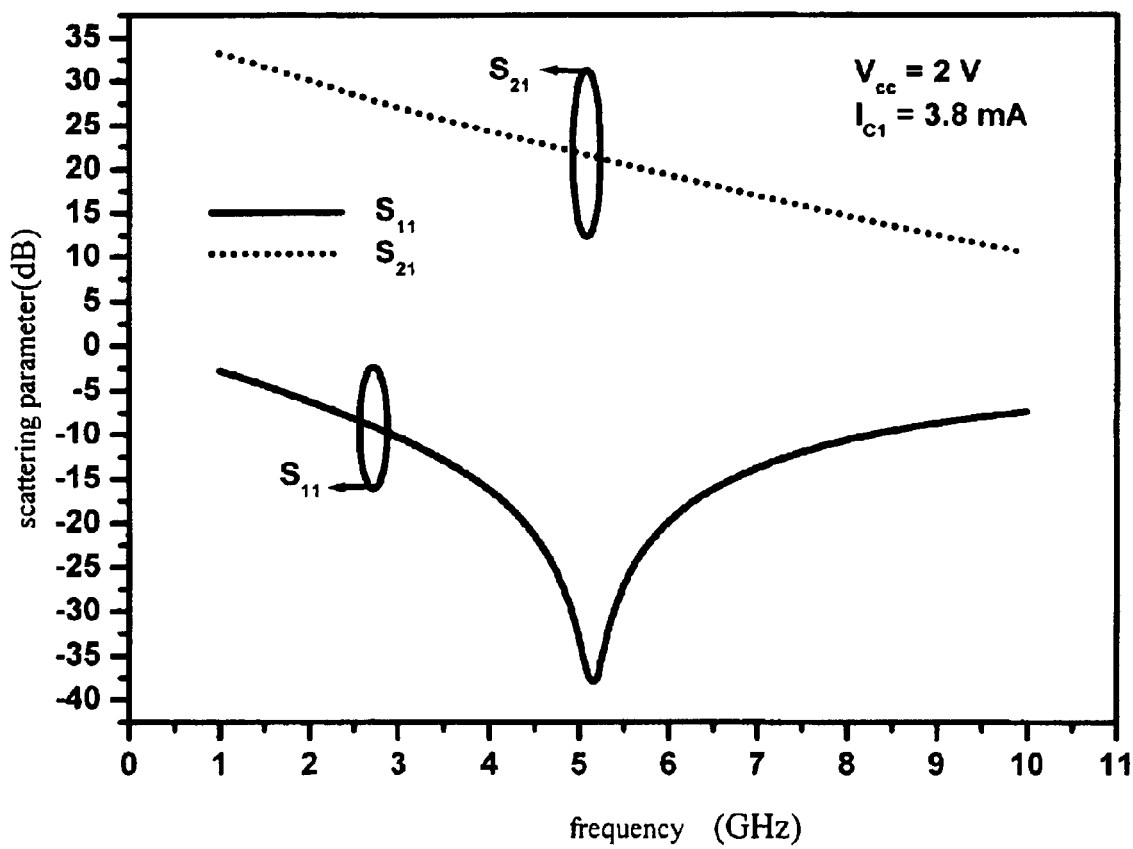
FIG. 5 illustrates the characteristics of gain and input return loss versus frequency of a 2.4/5.2/5.7 GHz multi-band low-noise amplifier according to the first preferred embodiment of the present invention when the switch is open.
Figure 7:
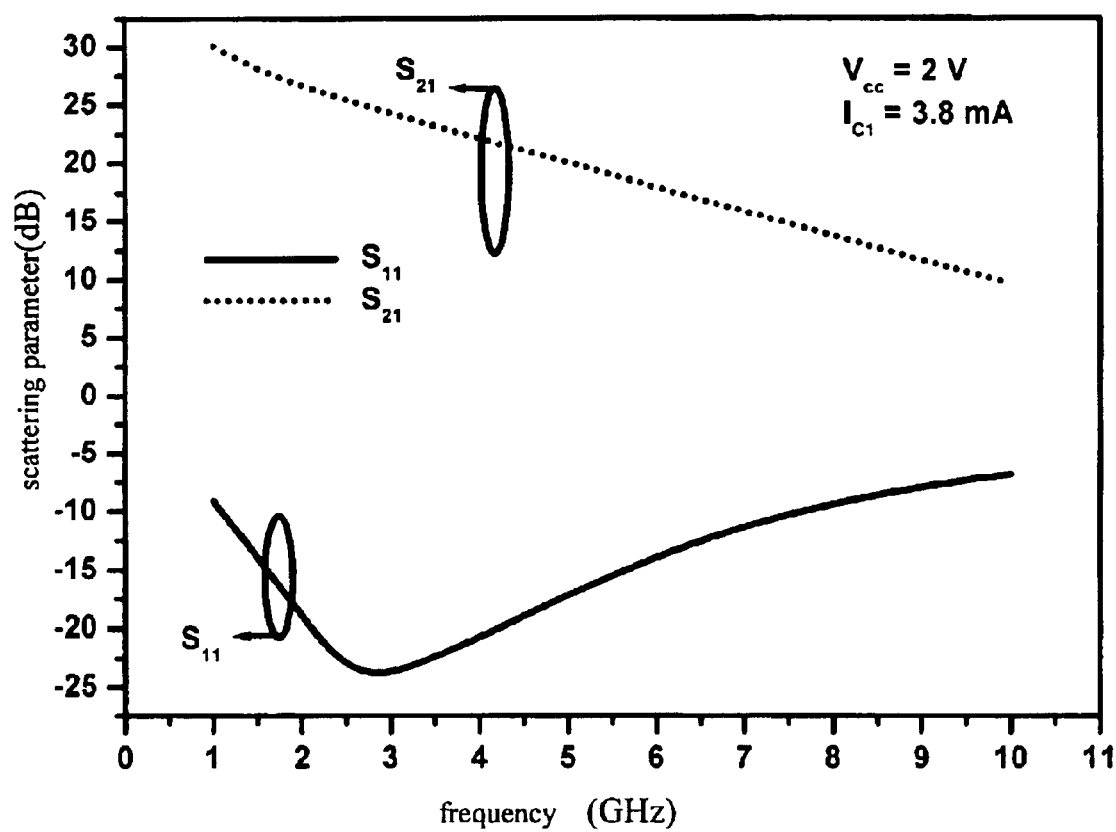
FIG. 7 illustrates the characteristics of gain and input return loss versus frequency of a 2.4/5.2/5.7 GHz multi-band low-noise amplifier according to the first preferred embodiment of the present invention when the switch is closed.

As for the performances regarding the gains and the input impedance matching of this proposed multi-band low-noise amplifier, please refer to FIGS. 5 and 7. The gains (scattering parameter $S_{21}$) of the provided multi-band low-noise amplifier at 5.2/5.7 GHz are 22 dB and 20 dB (the higher the better) respectively when the electronic switch 403 is open (See FIG. 5). The gain (scattering parameter $S_{21}$) of the provided multi-band low-noise amplifier at 2.4 GHz is 23 dB (the higher the better) when the electronic switch 403 is closed (See FIG. 7). The performance of input impedance matching is usually characterized by the input return loss, $S_{11}$, which is one of the scattering parameters. Referring to FIG. 5, the values of $S_{11}$ are lower than −20 dB (the lower the better) between 5.15 GHz and 5.35 GHz, and lower than −16 dB (the lower the better) between 5.725 GHz and 5.825 GHz when the electronic switch 403 is open. Referring to FIG. 7, the values of $S_{11}$ are lower than −22 dB (the lower the better) between 2.4 GHz and 2.5 GHz when the electronic switch 403 is closed.

Figure 6:
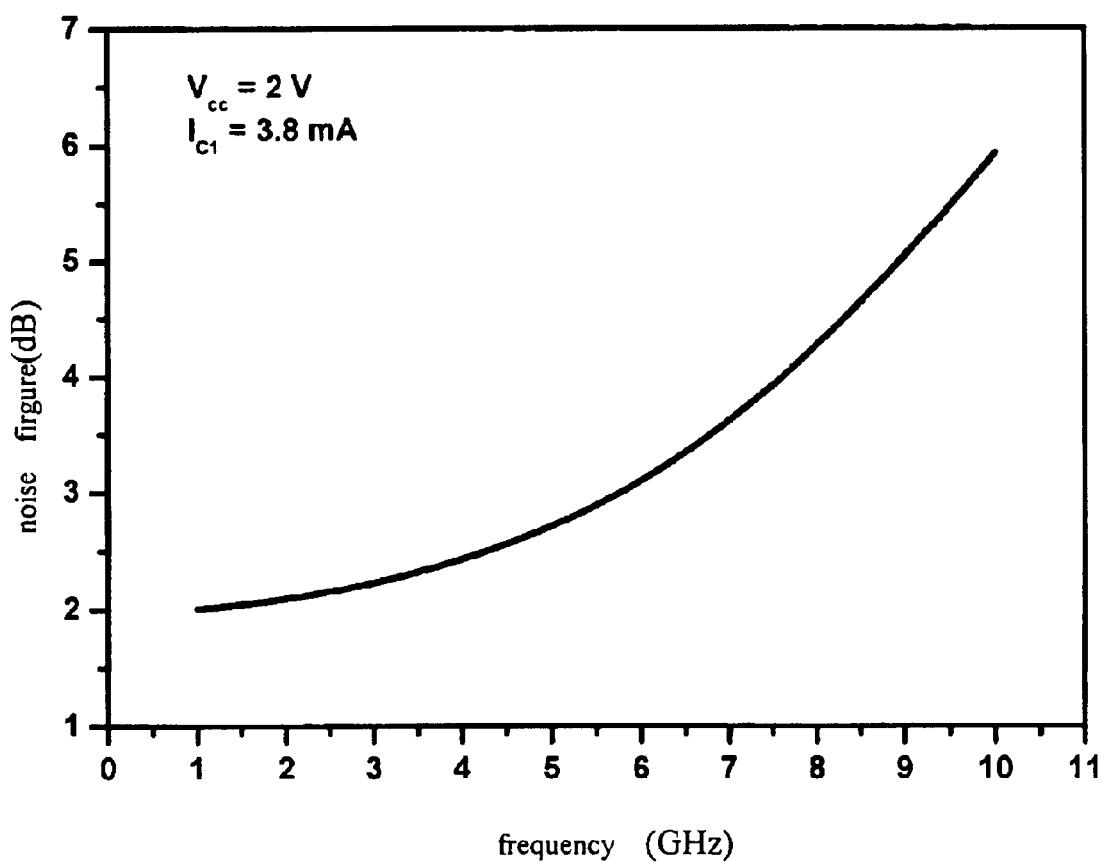
FIG. 6 illustrates the characteristics of noise figure versus frequency of a 2.4/5.2/5.7 GHz low-noise amplifier according to the first preferred embodiment of the present invention when the switch is open.
Figure 8:
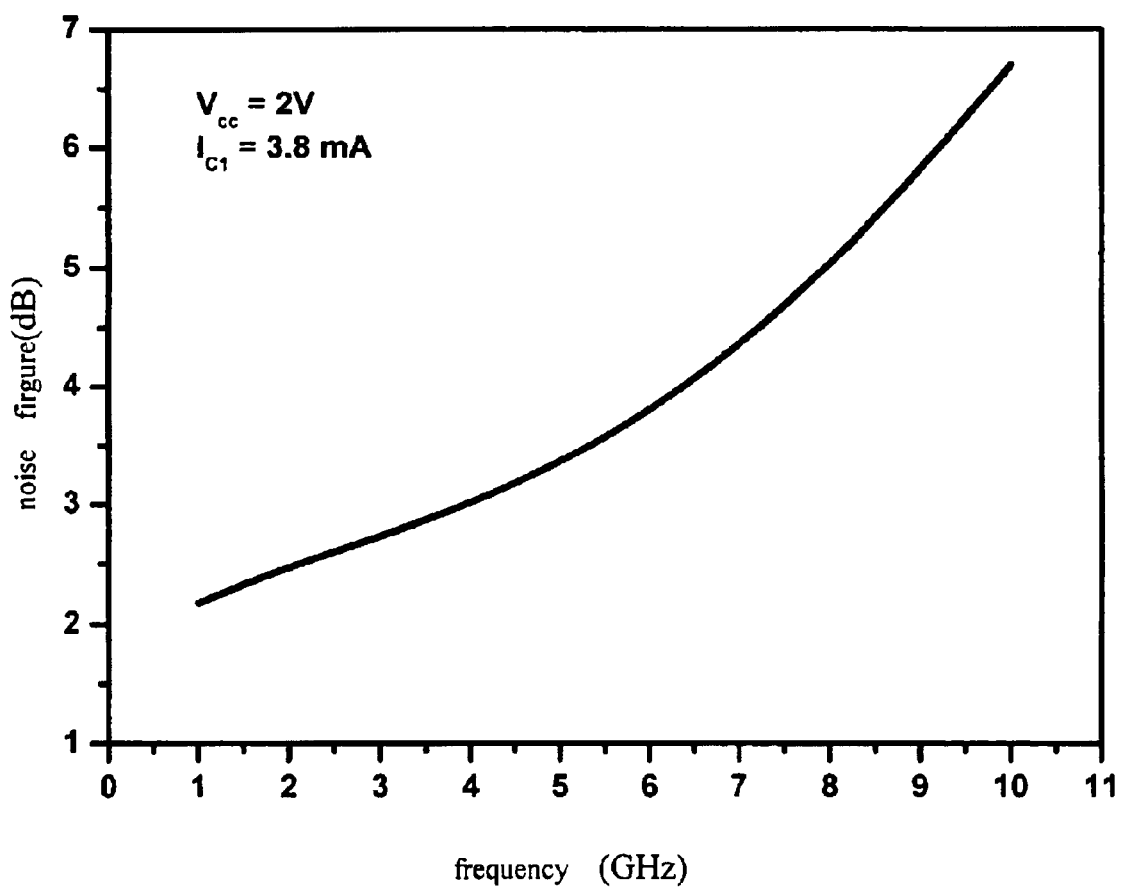
FIG. 8 illustrates the characteristics of noise figure versus frequency of a 2.4/5.2/5.7 GHz multi-band low-noise amplifier according to the first preferred embodiment of the present invention when the switch is closed.

As for the performances regarding the noise figures of this proposed low-noise amplifier, please refer to FIGS. 6 and 8. The noise figures are 2.75 dB and 3.0 dB (the lower the better) at the frequencies of 5.2/5.7 GHz respectively when the electronic switch 403 is open. The noise figure is 2.6 dB (the lower the better) at the frequency of 2.4 GHz when the electronic switch 403 is closed. For the applications of the 802.11a and 802.11b Wireless Local Area Network (WLAN), the noise figures of the low-noise amplifiers should be lower than 5 dB, the input/output loss return should be lower than −10 dB, and the gains should be larger than 10 dB. Thus the first preferred embodiment of the present invention, the 2.4/5.2/5.7 GHz multi-band low-noise amplifier, has very good results in terms of the gains, the noise figures, and the input impedance matching at the bands of 2.4 GHz, 5.2 GHz and 5.7 GHz. In order to make the input return loss $S_{11}$ even lower, a second inductor can be added and connected between the emitter of the first transistor 408 and the ground instead of connecting the emitter of the first transistor 408 to the ground directly.

Compared to the multi-band low-noise amplifiers in the prior art, the first preferred embodiment of the present invention can use a single amplifier to achieve the multi-band input impedance matching. There is neither the increase of the number of inductors, nor the increase of the die area dramatically, and no extra jobs of the wire-bonding and wiring are required. Though the combination of the electronic switch 403 and the second capacitor 415 electrically connected in series, which is electrically connected between the input terminal and the output terminal of the first transistor 408, is employed in the first preferred embodiment of the present invention as shown in FIG. 4, a variable capacitor (varactor) can be employed too.

Figure 9:
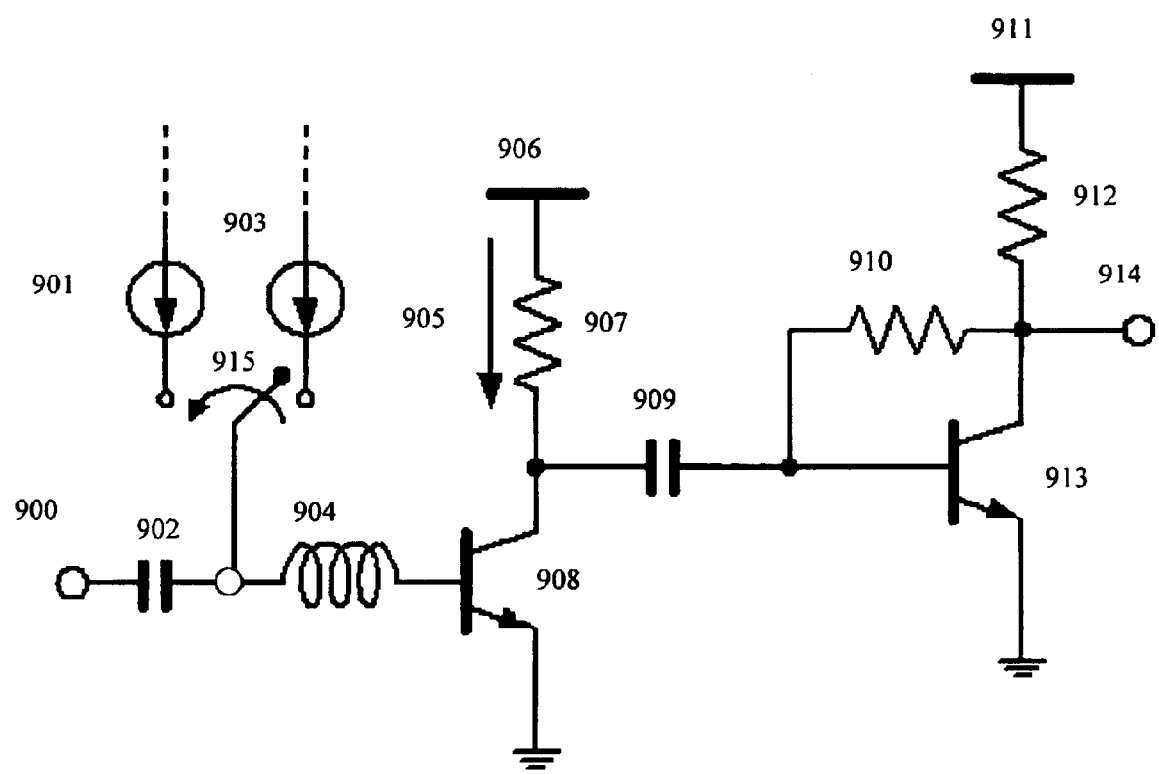
FIG. 9 is the circuit diagram of a 2.4/5.2/5.7 GHz multi-band low-noise amplifier according to the second preferred embodiment of the present invention.
Figure 10:
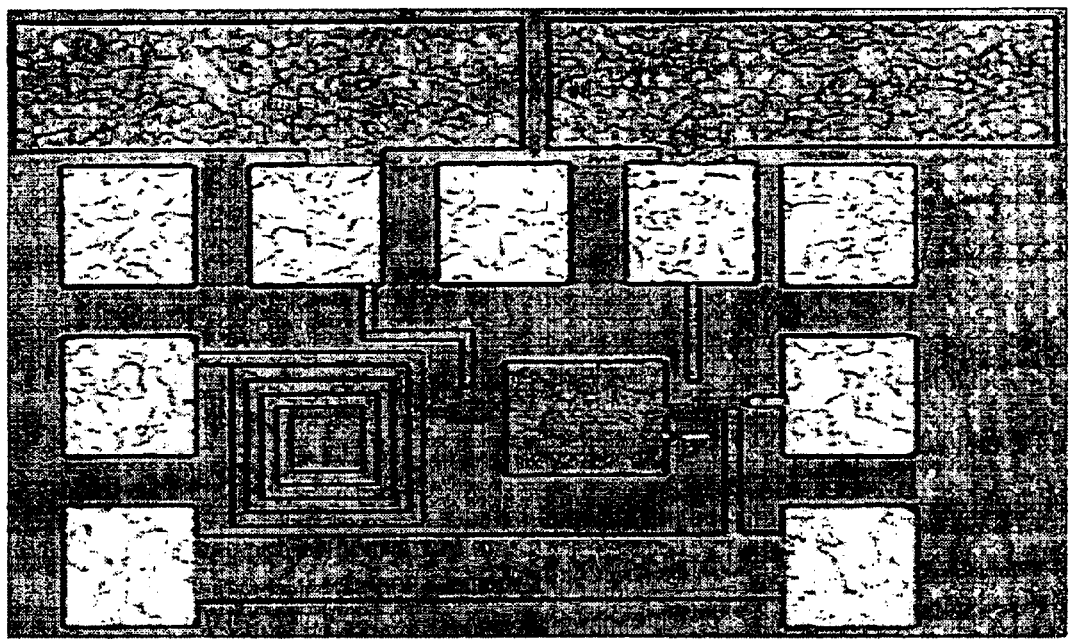
FIG. 10 shows the photograph of the chip of a 2.4/5.2/5.7 GHz multi-band low-noise amplifier according to the second preferred embodiment of the present invention.

Please refer to FIG. 9, which shows the circuit diagram of a 2.4/5.2/5.7 GHz multi-band low-noise amplifier according to the second preferred embodiment of the present invention. The circuit includes an input terminal 900, a switch 915, a first bias current source 901, a second bias current source 903, a DC block capacitor 902, an inductor 904, a first power supply 906, a first resistor 907 (with a collector current 905), a first transistor 908, a DC blocking/AC coupling capacitor 909, a second power supply 911, a second resistor 912, a third resistor 910, a second transistor 913, and an output terminal 914. In FIG. 9, the first bipolar transistor 908 has an emitter electrically connected to the ground, the inductor 904 is electrically connected to the base of the first bipolar transistor 908, the first resistor 907 has one end electrically connected to the collector of the first bipolar transistor 908, the first power supply 906 is electrically connected to the other end of the first resistor 907, the capacitor 909 has one end electrically connected to the collector of the first bipolar transistor 908, the second bipolar transistor 913 has the emitter electrically connected to the ground and the base electrically connected to the other end of the capacitor 909, the second resistor 912 has one end electrically connected to the collector of the second bipolar transistor 913 and the other end electrically connected to the second power supply 911, and the third resistor 910 is electrically connected between the base and the collector of the second bipolar transistor 913. Through changing the bias of the first bipolar transistor 908 of the electronic circuit, the resonant frequency of the input impedance of the first bipolar transistor 908 and the inductor 904 of the electronic circuit is switched from a first band to a second band in response to the changed bias for switching among multiple bands. In which, each of the first band and the second band is one of a plurality of bands of the resonant frequency. Though the bipolar junction transistors/heterojunction bipolar transistors are employed in this circuit for switching among multiple bands, field effect transistors can be employed too. In the second preferred embodiment of the present invention as shown in FIG. 9, both the first resistor 907 and the second resistor 912 have a resistance of 300 ohms, the third resistor 910 has a resistance of 600 ohms, the DC blocking/AC coupling capacitor 909 has a capacitance of 3 pF, and the areas of the emitters of the first transistor 908 and the second transistor 913 are both 12.18 $\mu m^2$. The TSMC 0.35 $\mu m$ SiGe BiCMOS process is employed. Referring to FIG. 9, a switch set, which includes a first bias current source 901, a second bias current source 903, and a switch, is employed to change the collector current of the first bipolar transistor 908 (following this change, the base current of the first bipolar transistor 908 is changed accordingly) so as to change the total input capacitance $C_{IN}$ looking into the base of the first bipolar transistor 908. The $C_{IN}$ and the inductor 904 electrically connected to the base of the first bipolar transistor 908 constitute the resonant circuit of the provided amplifier for achieving the gains, the noise figures, and the input impedance matching. When the switch of the switch set is connected to the first bias current source 901, the collector current 905 of the first bipolar transistor is 3 mA, and the resonant circuit formed by the $C_{IN}$ and the inductor 904 electrically connected to the base of the first bipolar transistor 908 will achieve the input impedance matching at 5.2/5.7 GHz (for WLAN IEEE 802.11a standard). When the switch of the switch set is connected to the second bias current source 903, the collector current 905 of the first bipolar transistor is 3.8 mA, and the resonant circuit formed by the $C_{IN}$ and the inductor 904 electrically connected to the base of the first bipolar transistor 908 will achieve the input impedance matching at 2.4 GHz (for WLAN IEEE 802.11b standard). As for the output terminal 914, the feedback resistor 910 is used to achieve the output impedance matching. When the output impedance matching is not needed (e.g., in cases of zero-IF and low-IF receivers), the feedback resistor 910 may not be necessary to achieve the output impedance matching. The first resistor 907 and the second resistor 912 are the loads of the first transistor 908 and the second transistor 913 respectively. Though the resistors are employed as the loads in this second preferred embodiment, the inductors and capacitors can be employed as the loads too. The main issue here is that a multi-band impedance matching at the input terminal of the provided circuit must be achieved too. FIG. 10 is the photograph of the chip of the 2.4/5.2/5.7 GHz multi-band low-noise amplifier according to the second preferred embodiment of the present invention. Since only one inductor 904 is employed, and the inductor 904 is manufactured on-chip, thus not only the whole proposed circuit can be manufactured on a single chip but also the area of the proposed circuit is relatively small (only 355 μm×155 μm). These are the advantages to facilitate the merchandizing of the proposed amplifiers.

Figure 11A:
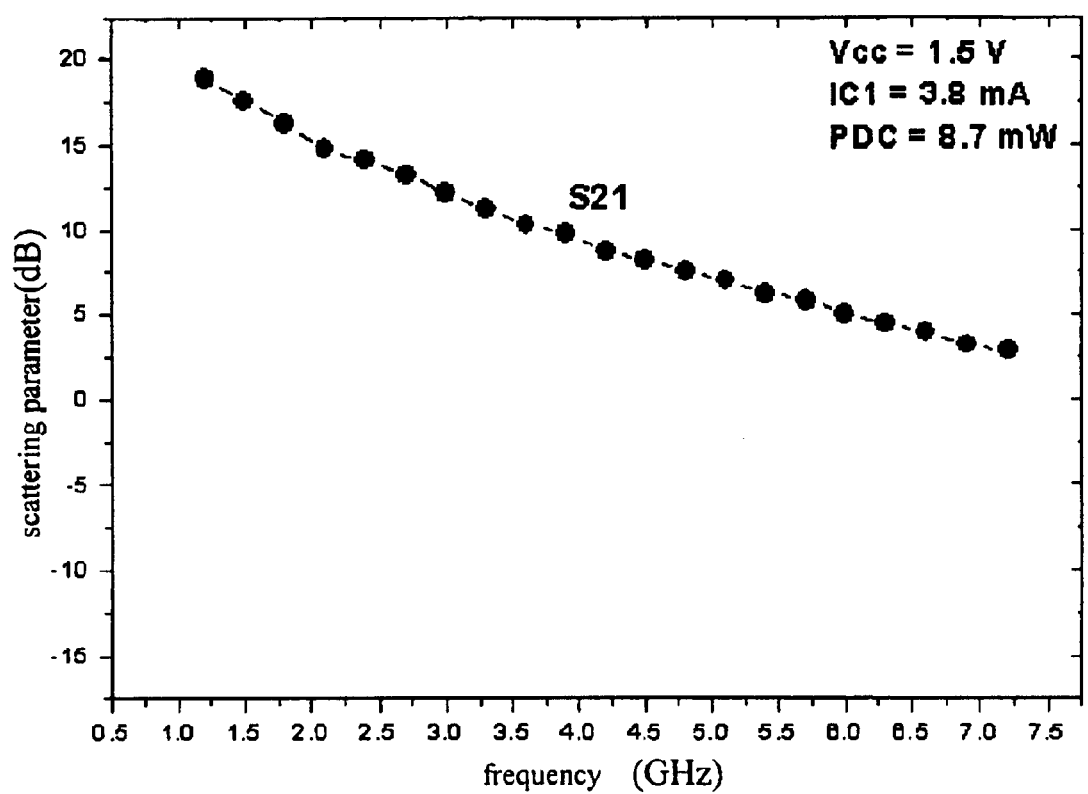
FIG. 11(a) illustrates the characteristics of gain versus frequency of a 2.4/5.2/5.7 GHz multi-band low-noise amplifier according to the second preferred embodiment of the present invention when the switch is connected to the second bias current source.
Figure 11B:
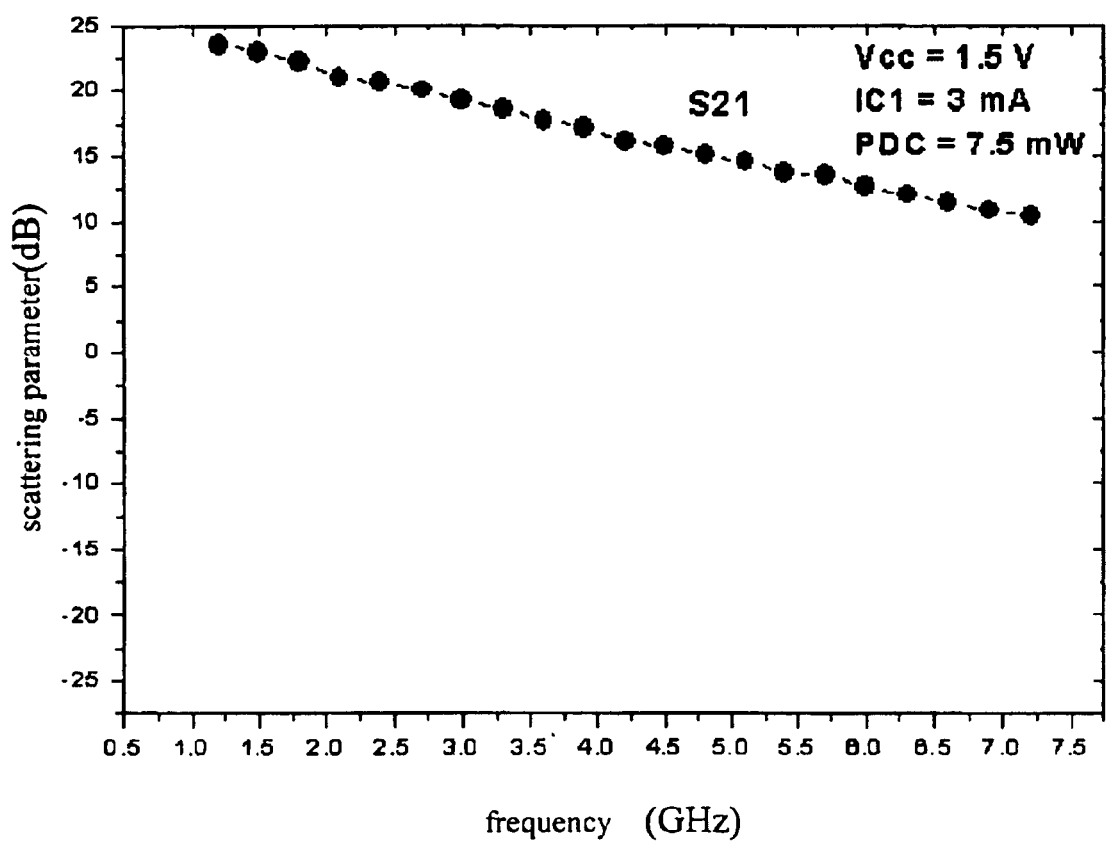
FIG. 11(b) illustrates the characteristics of gain versus frequency of a 2.4/5.2/5.7 GHz multi-band low-noise amplifier according to the second preferred embodiment of the present invention when the switch is connected to the first bias current source.
Figure 12A:
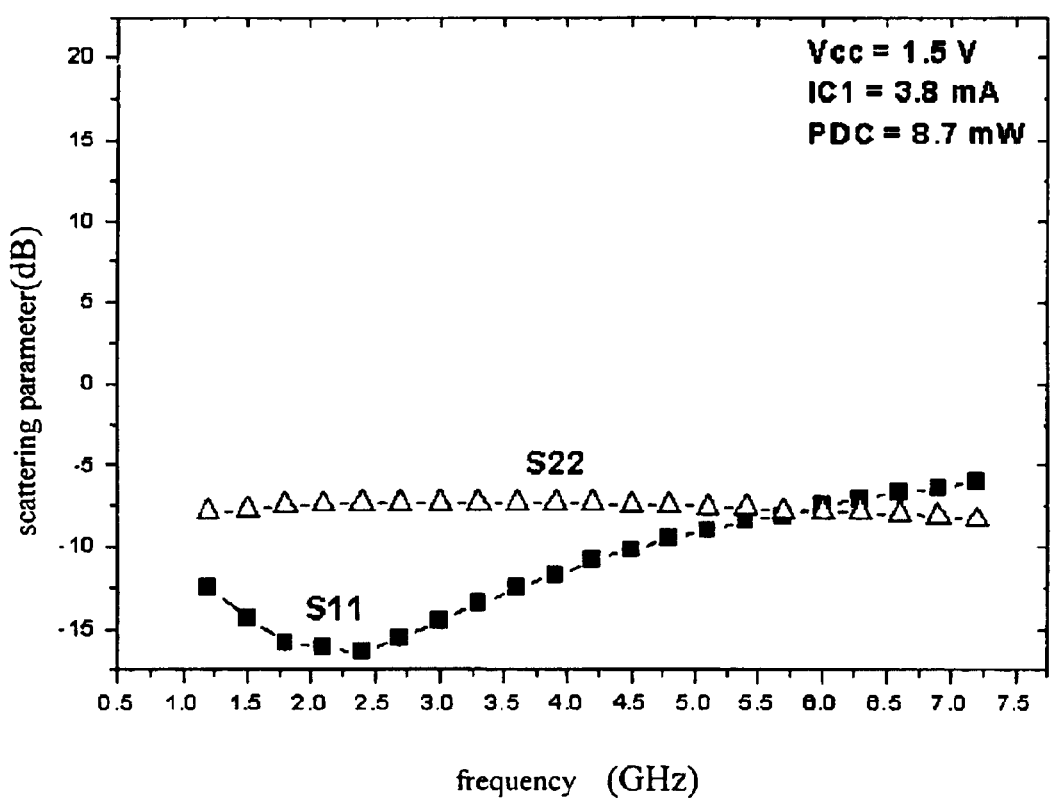
FIG. 12(a) illustrates the characteristics of input return loss versus frequency of a 2.4/5.2/5.7 GHz multi-band low-noise amplifier according to the second preferred embodiment of the present invention when the switch is connected to the second bias current source.
Figure 12B:
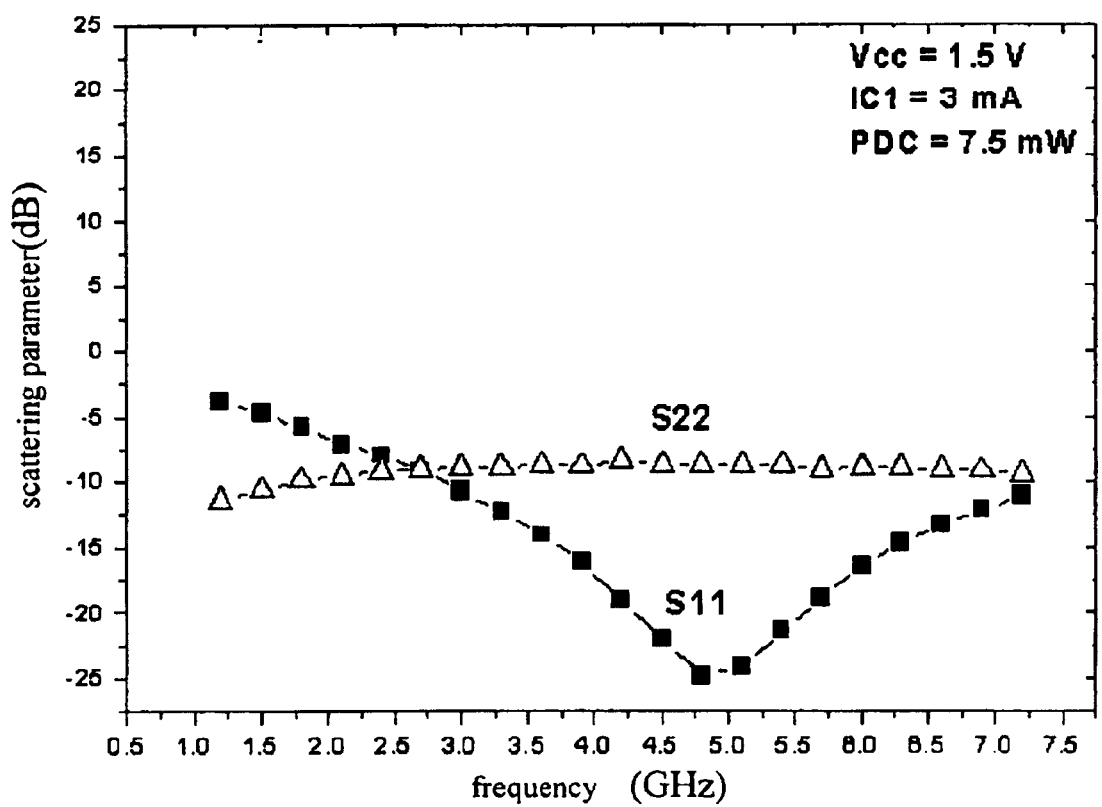
FIG. 12(b) illustrates the characteristic of input return loss versus frequency of a 2.4/5.2/5.7 GHz multi-band low-noise amplifier according to the second preferred embodiment of the present invention when the switch is connected to the first bias current source.

As for the performances regarding the gains of this provided multi-band low-noise amplifier, please refer to FIGS. 11(a) and 11(b). The gain (scattering parameter $S_{21}$) of the provided multi-band low-noise amplifier at 2.4 GHz is 14.1 dB (the higher the better) when the collector current 905 of the first bipolar transistor is 3.8 mA (See FIG. 11(a)). The gains (scattering parameter $S_{21}$) of the provided multi-band low-noise amplifier at 5.2/5.7 GHz are 14.3 dB and 13.5 dB (the higher the better) respectively when the collector current 905 of the first bipolar transistor is 3 mA (See FIG. 11(b)). The performance of input impedance matching is usually characterized by the input return loss, $S_{11}$, which is one of the scattering parameters. Referring to FIG. 12(a), the values of $S_{11}$ are lower than −15 dB (the lower the better) between 1.5 GHz and 3 GHz when the collector current 905 of the first bipolar transistor is 3.8 mA. The performance of output impedance matching is usually characterized by the output return loss, $S_{22}$, which is also one of the scattering parameters. Regarding the values of $S_{22}$ of the provided multi-band low-noise amplifier of the present invention (See FIG. 12(a)), it is quite good too (about −10 dB). For super-heterodyne receivers, output matching is important. But in the cases of zero-IF or low-IF receivers, output impedance matching is not important. Referring to FIG. 12(b), the values of $S_{11}$ are lower than −22 dB (the lower the better) between 5.15 GHz and 5.35 GHz, and are lower than −17.5 dB (the lower the better) between 5.725 GHz and 5.825 GHz when the collector current 905 of the first bipolar transistor is 3 mA. The output impedance matching is also quite good.

Figure 13:
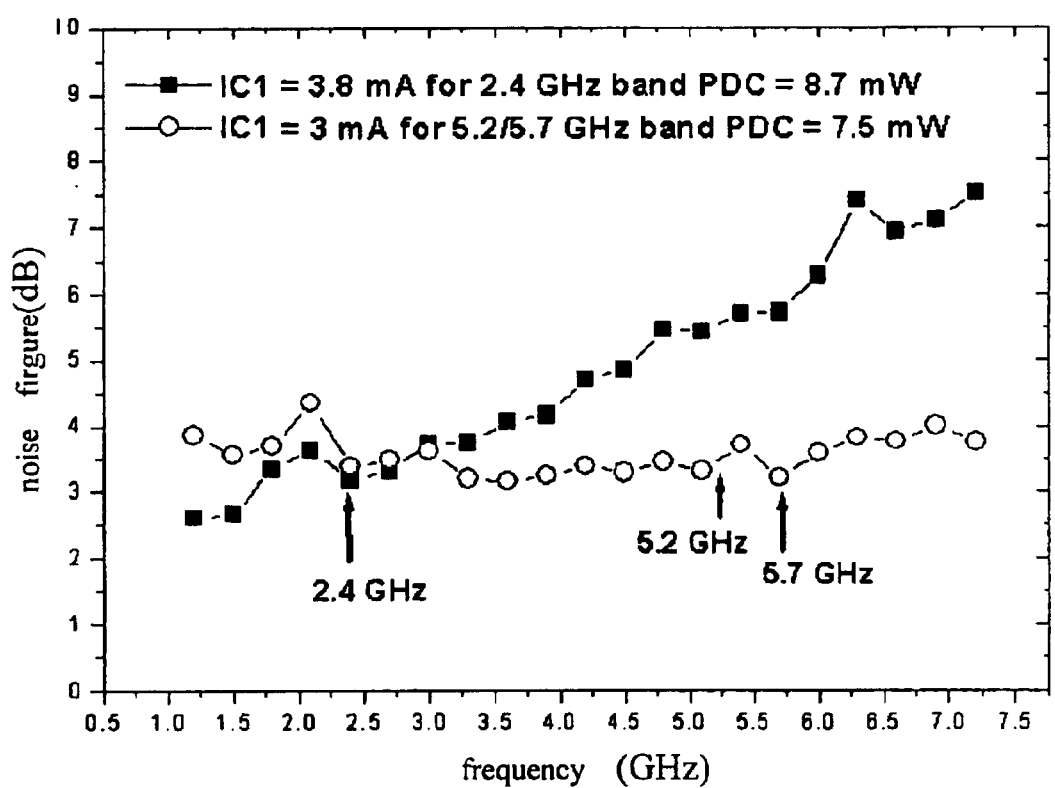
FIG. 13 illustrates the characteristics of noise figure versus frequency of a 2.4/5.2/5.7 GHz multi-band low-noise amplifier according to the second preferred embodiment of the present invention when the switch is connected to the second and the first bias current sources respectively.

As for the performances regarding the noise figures of this multi-band low-noise amplifier, please refer to FIG. 13. The noise figure is 3.18 dB (the lower the better) at the frequency of 2.4 GHz when the collector current 905 of the first bipolar transistor is 3.8 mA, and the noise figures are 3.42 dB and 3.21 dB (the lower the better) at the frequencies of 5.2/5.7 GHz respectively when the collector current 905 of the first bipolar transistor is 3 mA. For the applications of the 802.11a and 802.11b Wireless Local Area Network (WLAN), the noise figures of the low-noise amplifiers should be lower than 5 dB, the input/output loss return should be lower than −10 dB, and the gains should be larger than 10 dB. Therefore, the second preferred embodiment of the present invention, a 2.4/5.2/5.7 GHz multi-band low-noise amplifier, has very good results in terms of the gains, the noise figures, and the input/output impedance matching at the bands of 2.4 GHz, 5.2 GHz and 5.7 GHz.

Compared to the multi-band low-noise amplifiers in the prior art, the second preferred embodiment of the present invention can use a single amplifier to achieve the multi-band input impedance matching. There is neither the increase of the area occupied by the proposed amplifier nor the increase of the number of components, and no extra jobs of wire-bonding and wiring are required.

Although the invention has been shown and described in terms of specific embodiments, it will be evident that changes and modifications are possible which do not in fact depart from the inventive concepts taught herein. It will be appreciated by those skilled in the art that various omissions, additions and modifications may be made to the processes described above without departing from the scope of the invention, and all such modifications and changes are intended to fall within the scope of the invention, as defined in appended claims.

What is claimed is:

1. A multi-band electronic circuit, comprising:
   a first transistor having an input electrode, a first electrode electrically connected to a ground, and a second electrode;
   a first inductor electrically connected to said input electrode of said first transistor;
   a first resistor having one end electrically connected to said second electrode of said first transistor;
   a first power supply electrically connected to the other end of said first resistor;
   a capacitor having one end electrically connected to said second electrode of said first transistor;
   a second transistor having an input electrode electrically connected to the other end of said capacitor, a first electrode electrically connected to said ground and a second electrode;
   a second resistor having one end electrically connected to said second electrode of said second transistor;
   a second power supply electrically connected to the other end of said second resistor;
   a third resistor electrically connected between said input electrode and said second electrode of said second transistor; and
   a variable capacitance component electrically connected between said input electrode and said second electrode of said first transistor, wherein, through changing the capacitance of said variable capacitance component, the resonant frequency of the input impedance looking into said input electrode of said first transistor and said first inductor of said electronic circuit is switched from a first band to a second band in response to said changed capacitance for switching among multiple bands, wherein each of said first band and said second band is one of a plurality of bands of said resonant frequency.

2. The electronic circuit according to claim 1, wherein said variable capacitance component is a combination of a switch and a capacitor electrically connected in series, or a varactor.

3. The electronic circuit according to claim 1, wherein said electronic circuit further comprises a second inductor having one end electrically connected to said first electrode of said first transistor and the other end electrically connected to said ground.

4. The electronic circuit according to claim 1, wherein said first and second transistors are two bipolar transistors or two field effect transistors.

5. The electronic circuit according to claim 4, wherein said input, first and second electrodes of each of said two bipolar transistors are the base, the emitter and the collector of said bipolar transistors respectively.

6. The electronic circuit according to claim 4, wherein said input, first and second electrodes of each of said two field effect transistors are the gate, the source and the drain of said field effect transistors respectively.

7. An electronic circuit for a multi-band amplifier, comprising:
   a first transistor having an input electrode, a first electrode electrically connected to a ground, and a second electrode;
   an inductor electrically connected to said input electrode of said first transistor;
   a first resistor having one end electrically connected to said second electrode of said first transistor;
   a first power supply electrically connected to one end of said first resistor;
   a capacitor having one end electrically connected to said second electrode of said first transistor;
   a second transistor having an input electrode electrically connected to the other end of said capacitor, a first electrode electrically connected to said ground, and a second electrode;

a second resistor having one end electrically connected to said second electrode of said second transistor;

a second power supply electrically connected to the other end of said second resistor; and a third resistor electrically connected between said input electrode and said second electrode of said second transistor, wherein, through changing a bias of said first transistor of said electronic circuit, the resonant frequency of the input impedance of said first transistor and said inductor of said electronic circuit is switched from a first band to a second band in response to said changed bias for switching among multiple bands, wherein each of said first band and said second band is one of a plurality of bands of said resonant frequency.

8. The electronic circuit according to claim 7, wherein said first and second transistors are two bipolar transistors or two field effect transistors.

9. The electronic circuit according to claim 8, wherein said input, first and second electrodes of each of said two bipolar transistors are the base, the emitter and the collector of said bipolar transistors respectively.

10. The electronic circuit according to claim 9, wherein said bias of said first bipolar transistor is the base bias current of said bipolar transistor, the collector bias current of said bipolar transistor, the emitter bias current of said bipolar transistor, or the base bias voltage of said bipolar transistor.

11. The electronic circuit according to claim 8, wherein said input, first and second electrodes of each of said two field effect transistors are the gate, the source and the drain of said field effect transistors respectively.

12. The electronic circuit according to claim 11, wherein said bias of said first field effect transistor is the drain-to-source bias current of said field effect transistor, or the gate bias voltage of said field effect transistor.

* * * * *